United States Patent
Liu

(10) Patent No.: US 9,553,206 B2
(45) Date of Patent: Jan. 24, 2017

(54) EEPROM CORE STRUCTURE EMBEDDED INTO BCD PROCESS AND FORMING METHOD THEREOF

(75) Inventor: Jianhua Liu, Shanghai (CN)

(73) Assignee: ADVANCED SEMICONDUCTOR MANUFACTURING CO., LTD., Beijing (CN)

( * ) Notice: Subject to any disclaimer, the term of this patent is extended or adjusted under 35 U.S.C. 154(b) by 0 days.

(21) Appl. No.: 14/238,057

(22) PCT Filed: Jan. 19, 2012

(86) PCT No.: PCT/CN2012/070571
§ 371 (c)(1),
(2), (4) Date: Feb. 10, 2014

(87) PCT Pub. No.: WO2013/023445
PCT Pub. Date: Feb. 21, 2013

(65) Prior Publication Data
US 2014/0167130 A1    Jun. 19, 2014

(30) Foreign Application Priority Data

Aug. 12, 2011  (CN) .......................... 2011 1 0231902
Jan. 19, 2012  (WO) .......................... CN2012/070571

(51) Int. Cl.
*H01L 29/788* (2006.01)
*H01L 29/66* (2006.01)
*H01L 27/115* (2006.01)
*H01L 21/8249* (2006.01)

(52) U.S. Cl.
CPC ....... *H01L 29/788* (2013.01); *H01L 27/11546* (2013.01); *H01L 29/66825* (2013.01); *H01L 29/7881* (2013.01); *H01L 21/8249* (2013.01)

(58) Field of Classification Search
USPC ...................... 257/315; 365/185.11; 438/239
See application file for complete search history.

(56) References Cited

U.S. PATENT DOCUMENTS 7,465,621 B1   12/2008  You et al.
2008/0266958 A1*  10/2008  Haggag .............. G11C 16/0416
                                                365/185.11

FOREIGN PATENT DOCUMENTS

| CN | 1725468 A | 1/2006 |
| CN | 102263110 | 11/2011 |
| KR | 20030050357 | 6/2003 |
| WO | 2011018114 A1 | 2/2011 |

OTHER PUBLICATIONS

International Search Report under date of May 11, 2012 in connection with PCT/CN2013/070571.

* cited by examiner

*Primary Examiner* — Zandra Smith
*Assistant Examiner* — Lawrence Tynes, Jr.
(74) *Attorney, Agent, or Firm* — Quarles & Brady LLP

(57) ABSTRACT

The present invention provides an EEPROM core structure embedded into BCD process and forming method thereof. The EEPROM core structure embedded into BCD process comprises a selection transistor and a storage transistor connected in series, wherein the selection transistor is an LDNMOS transistor. The present invention may embed the procedure for forming the EEPROM core structure into the BCD process, which is favorable to reduce the complexity of the process.

11 Claims, 4 Drawing Sheets

| A SEMICONDUCTOR SUBSTRATE IS PROVIDED, AN N-WELL, ACTIVE AREAS AND A P-WELL ARE FORMED ON THE SEMICONDUCTOR SUBSTRATE, WHEREIN THE ACTIVE AREAS INCLUDE AN ACTIVE AREA OF A SELECTION TRANSISTOR LOCATED IN THE N-WELL AND AN ACTIVE AREA OF A STORAGE TRANSISTOR LOCATED IN THE P-WELL | S11 |

| TUNNEL ION INJECTION IS PERFORMED ON THE ACTIVE REGION OF THE STORAGE TRANSISTOR, AND A TUNNEL INJECTION LAYER IS FORMED IN THE ACTIVE AREA OF THE STORAGE TRANSISTOR | S12 |

| A GATE DIELECTRIC LAYER OF THE SELECTION TRANSISTOR IS FORMED ON THE ACTIVE AREA OF THE SELECTIONTRANSISTOR, AND A TUNNELING DIELECTRIC LAYER FOR THE STORAGE TRANSISTOR IS FORMED ON THE TUNNEL INJECTION LAYER | S13 |

| A GATE OF THE SELECTION TRANSISTOR IS FORMED ON THE GATE DIELECTRIC LAYER FOR THE SELECTION TRANSISTOR, AND A FLOATING GATE OF THE STORAGE TRANSISTOR IS FORMED ON THE TUNNELING DIELECTRIC LAYER | S14 |

| A FLOATING GATE DIELECTRIC LAYER AND A CONTROL GATE ARE FORMED IN SEQUENCE ON THE FLOATING GATE OF THE STORAGE TRANSISTOR, WHEREIN THE FLOATING GATE IS COVERED BY THE FLOATING GATE DIELECTRIC LAYER, AND THE FLOATING GATE DIELECTRIC LAYER IS COVERED BY THE CONTROL GATE | S15 |

| A SOURCE REGION AND A DRAIN REGION OF THE SELECTION TRANSISTOR ARE FORMED IN THE ACTIVE AREA OF THE SELECTION TRANSISTOR AT TWO SIDES OF THE GATE OF THE SELECTION TRANSISTOR, AND A SOURCE REGION AND A DRAIN REGION OF THE STORAGE TRANSISTOR ARE FORMED IN THE ACTIVE AREA OF THE STORAGE TRANSISTOR AT TWO SIDES OF THE CONTROL GATE, WHEREIN THE SELECTION TRANSISTOR IS AN LDNMOS TRANSISTOR | S16 |

FIG. 1

EEPROM CORE STRUCTURE EMBEDDED INTO BCD PROCESS AND FORMING METHOD THEREOF

CROSS-REFERENCE TO RELATED APPLICATIONS

This application represents the national stage entry of PCT International Application No. PCT/CN2012/070571 filed Jan. 19, 2012, which claims priority to Chinese Patent Application 201110231902.2 filed Aug. 12, 2011, the disclosures of which are hereby incorporated by reference in their entirety for all purposes.

FIELD OF THE INVENTION

The present invention relates to the field of semiconductor devices and semiconductor processes, and more particularly to an EEPROM core structure embedded into BCD process and forming method thereof.

BACKGROUND

A BCD process is a technique for monolithic integrated process, through which devices such as bipolar transistor (Bipolar), complementary metal-oxide field effect transistor (CMOS), and double-diffused metal-oxide field effect transistor (DMOS) can be fabricated on the same chip, abbreviated as BCD process. The BCD process is gaining more and more attention since the BCD process synthesizes respective advantages of the three types of devices above.

Products such as a system on chip (SOC) formed through the BCD process may apply to aspects such as automotive electronics, power management, etc. In such applications, there is often a need to integrate electrically-erasable programmable read-only memory (EEPROM) into the product. However, both traditional BCD process and EEPROM formation process are quite complex. Thus, how to embed EEPROM into the BCD process and how to optimize the process so as to simplify its process become a hot area for research in recent years.

The traditional EEPROM core structure (also know as bit cell) primarily includes two transistors, one of which being a high voltage (e.g., 15V) NMOS transistor as a selection transistor, and the other one being a storage transistor with a floating gate. The process for forming the high voltage NMOS transistor and the storage transistor is quite complex. Take an example of a product which includes a 3.3V low voltage CMOS transistor, a 15V high voltage CMOS transistor and a storage transistor (including three metal layers), then the number of photolithography layers shall be more than 23. The conventional BCD process is also very complex, including forming process for devices such as low CMOS transistors, middle and high voltage LDNMOS transistors, bipolar transistors, resistors, capacitors, etc. The number of basic photolithography layers for the BCD process (including two metal layers) is more than 21. Therefore, if the process for forming traditional EERPOM core structure is simply embedded into the BCD process, its process procedure would become too complex, making no sense to be applied in industry.

SUMMARY

The present invention is directed to solving a technical problem of providing an EEPROM core structure embedded into BCD process and forming method thereof, and reducing the complexity of the process.

To solve the above technical problem, the present invention provides an EEPROM core structure embedded into BCD process, which includes a selection transistor and a storage transistor connected in series, the selection transistor being an LDNMOS transistor.

Optionally, a floating gate of the storage transistor has a hollow box-shaped plane figure, which includes a first side and a second side that extend along a first direction, a third side and a fourth side that extend along a second direction, wherein the first direction is parallel to an extending direction of an active area of the storage transistor, the second direction is perpendicular to the first direction, and the active area of the storage transistor is located between the first side and the second side.

Optionally, a source region of the LDNMOS transistor (lateral diffused N-type metal-oxide field effect transistor) abuts a drain region of the storage transistor.

Optionally, the third side is close to the drain region of the storage transistor, the fourth side is close to the source region of the storage transistor, a tunnel injection layer of the storage transistor is located in the active area of the storage transistor under the third side.

Optionally, a tunneling dielectric layer of the storage transistor is located under the third side and located above the tunnel injection layer. Under the fourth side there is an isolating dielectric layer having a thickness identical to that of a gate dielectric layer of the selection transistor and greater than that of the tunneling dielectric layer.

The present invention also provides a method for forming an EEPROM core structure embedded into BCD process, including:

providing a semiconductor substrate, forming an N-well, active area and a P-well on the semiconductor substrate, the active areas including an active area of a selection transistor located in the N-well and an active area of a storage transistor located in the P-well;

performing tunnel ion implanting on the active area of the storage transistor, forming a tunnel injection layer in the active area of the storage transistor;

forming a gate dielectric layer for the selection transistor on the active area of the selection transistor, forming a tunneling dielectric layer for the storage transistor on the tunnel injection layer;

forming a gate of the selection transistor on the gate dielectric layer of the selection transistor, forming a floating gate of the storage transistor on the tunneling dielectric layer;

forming a floating gate dielectric layer and a control gate in sequence on the floating gate of the storage transistor, wherein the floating gate is covered by the floating gate dielectric layer, and the floating gate dielectric layer is covered by the control gate;

forming a source region and a drain region of the selection transistor in the active area of the selection transistor at two sides of the gate of the selection transistor, forming a source region and a drain region of the storage transistor in the active area of the storage transistor at two sides of the control gate, wherein the selection transistor is an LDNMOS transistor.

Optimally, the formation of a gate of the selection transistor on the gate dielectric layer for the selection transistor and a floating gate of the storage transistor on the tunneling dielectric layer comprises: forming a first polysilicon layer and etching the first polysilicon layer to form the gate of the selection transistor and the floating gate, wherein the floating gate has a hollow box-shaped plane figure, which includes a first side and a second side that extend along a first direction, a third side and a fourth side that extend along a second direction, wherein the first direction is parallel to an extending direction of the active area of the storage transistor, the second direction is perpendicular to the first direction, the active area of the storage transistor is located between the first side and the second side.

Optionally, the source region of the selection transistor abuts the drain region of the storage transistor.

Optionally, the third side is close to the drain region of the storage transistor, the fourth side is close to the source region of the storage transistor, the tunnel injection layer of the storage transistor is covered by the third side.

Optionally, the tunneling dielectric layer of the storage transistor is located under the third side and located above the tunnel injection layer. Under the fourth side there is an isolating dielectric layer having a thickness identical to that of the gate dielectric layer of the selection transistor and greater than that of the tunneling dielectric layer.

Optionally, the procedure for forming the control gate comprises: forming a second polysilicon layer and etching the second polysilicon layer to form the control gate of the storage transistor, and forming a capacitor plate of a peripheral circuit.

Optionally, after *forming the source regions and the drain regions of the selection transistor and the storage transistor, the method for forming an EEPROM core structure embedded into BCD process further comprises:

forming metal silicide on the surface of the source regions and the drain regions of the selection transistor and the storage transistor;

forming an inter-layer dielectric layer covering the selection transistor and the storage transistor;

forming contact holes in the inter-layer dielectric layer above the source regions and the drain regions of the selection transistor and the storage transistor, the gate of the selection transistor and/or the control gate of the storage transistor ;

filling an interconnection structure in the contact holes.

Compared with the prior art, the present invention enjoys the following advantages.

In the EEPROM core structure embedded into BCD process according to an embodiment of the present invention, an LDNMOS transistor which may be formed through standard BCD process is adopted as the selection transistor, which is favorable to reduce the complexity of its process.

In addition, in the method for forming an EEPROM core structure embedded into BCD process according to an embodiment of the present invention, a tunnel ion implanting process is added into the standard BCD process to form a tunnel injection layer of the storage transistor, an LDNMOS transistor serving as the selection transistor for the EEPROM core structure is formed through conventional steps in the BCD process. Thus, the procedure for forming the EEPROM core structure is embedded into the BCD process, which means that merely a step of tunnel ion implanting process is added, and the complexity of the process is significantly reduced accordingly.

BRIEF DESCRIPTION OF THE DRAWINGS

FIG. 1 is a flowchart of a method for forming an EEPROM core structure embedded into BCD process according to an embodiment of the present invention;

DETAILED DESCRIPTION

Figure 2:
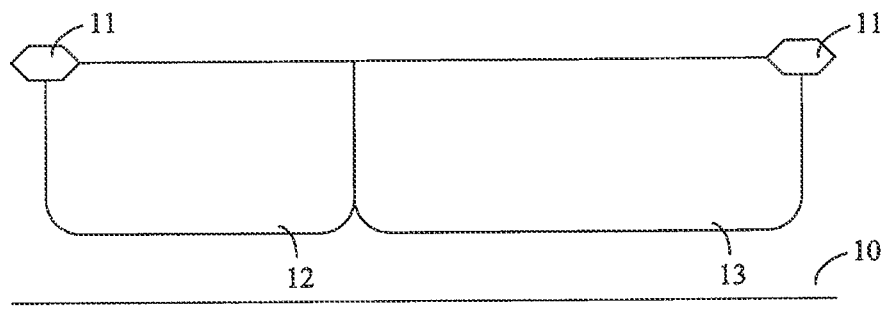
FIGS. 2-8 are schematics of cross-section views and a portion of top views for steps in the method for forming an EEPROM core structure embedded into BCD process according to an embodiment of the present invention.

In prior art, the conventional process for forming an EEPROM core structure and processing steps for BCD process are both quite complex. If EERPOM is simply embedded into the BCD process, the addition of the steps of both processes would make the process too complex, which is unfavorable to large scale production in industry.

In an EEPROM core structure embedded into BCD process according to an embodiment of the present invention, an LDNMOS transistor which may be formed through standard BCD process is adopted as a selection transistor, which is favorable to reduce the complexity of its process.

In addition, in a method for forming an EEPROM core structure embedded into BCD process according to an embodiment of the present invention, a tunnel ion implanting process is added into the standard BCD process to form a tunnel injecting layer of the storage transistor, an LDNMOS transistor serving as a selection transistor for the EEPROM core structure is formed through conventional steps in the BCD process. Thus, the procedure for forming the EEPROM core structure is embedded into the BCD process, which means that merely a step of tunnel ion implanting process is added, and the complexity of the process accordingly is significantly reduced.

Further description will be made to the present invention in conjunction with specific embodiments and accompanying drawings, while the scope of the present invention is not so limited.

FIG. 1 illustrates a flowchart of a method for forming an EEPROM core structure embedded into BCD process according to the present embodiment, which includes following steps.

At step S11, a semiconductor substrate is provided, and an N-well, active areas and a P-well are formed on the semiconductor substrate, wherein the active areas include an active area of a selection transistor located in the N-well and an active area of a storage transistor located in the P-well.

At step S12, tunnel ion implanting is performed on the active area of the storage transistor, and a tunnel injection layer is formed in the active area of the storage transistor.

At step S13, a gate dielectric layer of the selection transistor is formed on the active area of the selection transistor, and a tunneling dielectric layer for the storage transistor is formed on the tunnel injection layer.

At step S14, a gate of the selection transistor is formed on the gate dielectric layer of the selection transistor, and a floating gate of the storage transistor is formed on the tunneling dielectric layer.

At step S15, a floating gate dielectric layer and a control gate are formed in sequence on the floating gate of the storage transistor, wherein the floating gate is covered by the floating gate dielectric layer, and the floating gate dielectric layer is covered by the control gate.

At step S16, a source region and a drain region of the selection transistor are formed in the active region of the selection transistor at two sides of the gate of the selection transistor, and a source region and a drain region of the storage transistor are formed in the active region of the storage transistor at two sides of the control gate, wherein the selection transistor is an LDNMOS transistor.

Detailed processing steps according to the present embodiment are shown in the following table.

| sequence | EEPROM core structure | peripheral circuit for BCD process |
|---|---|---|
| 1 |  | N-type buried layer |
| 2 | high voltage N-well | high voltage N-well |
| 3 | active area | active area |
| 4 | high voltage P-well | high voltage P-well |
| 5 | tunnel ion implanting |  |
| 6 | low voltage P-well | low voltage P-well |
| 7 | low voltage N-well | low voltage N-well |
| 8 | dual gate oxide layer | dual gate oxide layer |
| 9 | gate of selection transistor and floating gate of storage transistor | polysilicon gate |
| 10 | ion implanting for N-type source/drain low concentration drift region | ion implanting for N-type source/drain low concentration drift region |
| 11 |  | ion implanting for P-type source/drain low concentration drift region |
| 12 | control gate of storage transistor | capacitor plate of peripheral circuit |
| 13 | ion implanting for N-type source/drain | ion implanting for N-type source/drain |
| 14 |  | ion implanting for P-type source/drain |
| 15 | selectively formed metal silicide | selectively formed metal silicide |
| 16 | contact hole | contact hole |
| 17 | first metal line | first metal line |
| 18 | via hole for the second metal layer and the first metal layer | via hole for the second metal layer and the first metal layer |
| 19 | second layer of metal line | second layer of metal line |
| 20 | via hole for top metal layer and the second metal layer | via hole for top metal layer and the second metal layer |
| 21 | top layer metal line | top layer metal line |
| 22 | alloy window opened in passivation layer | alloy window opened in passivation layer |

As shown in the above table, the solution of the present embodiment may combine the process for forming the EEPROM core structure with the peripheral circuit for the BCD process, in which most processing steps can be shared, thereby significantly reducing the complexity of the overall processing procedure. Wherein, the peripheral circuit for the BCD process may be a peripheral circuit which may be used in conjunction with the EEPROM core structure, or a device or a circuit formed along with EEPROM core structure on the same semiconductor substrate, etc.

Specifically, process sequence 1 refers to a procedure for forming an N-type buried layer. The process step merely applies to the peripheral circuit of the BCD process, while the step is not needed in the procedure for forming the EEPROM core structure.

Process sequences 2-4 refer to procedures for forming a high voltage (e.g., 15V, 20V, 40V, 60V, etc.) N-well, active areas, and a high voltage P-well, respectively. These processing steps may be shared by the EEPROM core structure and the peripheral circuit of the BCD process.

Process sequence 5 refers to tunnel ionimplanting. This processing step merely applies to the procedure for forming the EEPROM core structure so as to form a tunnel injection layer below a floating gate, while this step is not needed in the procedure for forming the peripheral circuit of the BCD process, Process sequences 6-8 refer to procedures for forming a low voltage (e.g., 3.3V, 5V, etc.) P-well, a low voltage N-well, and a dual gate oxide layer, respectively. These processing steps may be used by the procedure for forming the EEPROM core structure and the peripheral circuit of the BCD process. Wherein, in the procedure for forming the EEPROM core structure, the dual gate oxide layer refers to forming a thicker gate for the selection transistor and a relatively thin floating gate for the storage transistor; while during the procedure for forming the peripheral circuit of the BCD process, the dual gate oxide layer refers to gate oxide layers for a high voltage device and a low voltage device.

Process sequence 9 may also be the processing step that can be shared by the EEPROM core structure and the peripheral circuit of the BCD process, and primarily includes the procedure for forming and patterning a first polysilicon layer. In the procedure for forming the EEPROM core structure, the processing step 9 refers to the procedure for forming a gate of the selection transistor and a floating gate of the storage transistor, whereas in the peripheral circuit of the BCD process, the processing step 9 refers to the procedure for forming polysilicon gates, both of which may use the same polysilicon layer, i.e., after forming the first polysilicon layer, patterning the first polysilicon layer to form desired pattern respectively.

Process sequence 10 may also be the processing step that can be shared by the EEPROM core structure and the peripheral circuit of the BCD process, and specifically, ion implanting for N-type source/drain low concentration drift region.

Process sequence 11 refers to ion implanting for P-type source/drain low concentration drift region, which merely applies to the procedure for forming the peripheral circuit of the BCD process. This process is not needed in the procedure for forming the EEPROM core structure.

Process sequence 12 may also be the processing step that can be shared by the EEPROM core structure and the peripheral circuit of the BCD process, and primarily includes the procedure for forming and patterning a second polysilicon. In the procedure for forming the EEPROM core structure, this processing step refers to the procedure for forming a control gate of the storage transistor, while in the peripheral circuit of the BCD process, this processing step refers to the procedure for forming a capacitor plate of the peripheral circuit, both of which may use the same polysilicon layer, i.e., after forming the second polysilicon layer, patterning the second polysilicon layer to form desired patterns respectively.

Process sequence 13 refers to ion implanting for N-type source/drain. The processing step can be shared by the EEPROM core structure and the peripheral circuit of the BCD process.

Process sequence 14 merely applies to the procedure for forming the peripheral circuit of the BCD process. Such processing is not needed in the procedure for forming the EEPROM core structure.

Process sequences 15-22 refer to procedures for forming a selectively formed metal suicide, a contact hole, a first metal line, a via hole for a second metal and a first metal, a second layer of metal line, a via hole for a top metal layer and the second metal layer, a top layer metal line and a alloy window in passivation layer, respectively. All of the above processing steps may also be shared by the EEPROM core structure and the peripheral circuit of the BCD process.

It is to be noted that those shown in the table above are main processing steps only. Other specific steps may be added into specific embodiment according to various practical requirements. In addition, the sequence for the processing steps is not strictly limited. Rather, the sequence can be adjusted as long as procedures for forming the devices can be implemented, e.g., the sequences for forming a high voltage N-well and a high voltage P-well may be interchangeable. In addition, "high voltage" and "low voltage" herein are merely relative concept, and are not intended to be limiting as to a range of voltage.

Since most of the processing steps can be shared, the procedure for forming the EEPROM core structure may be very simply embedded into the BCD process, i.e., forming the EEPROM core structure and the peripheral circuit of the BCD process simultaneously on the same semiconductor substrate via a simple process.

FIGS. 2-8 illustrate schematics of cross-section views and a portion of top views for steps according to the present embodiment.

Referring in combination with FIG. 1 and FIG. 2, step S11 is performed, in which a semiconductor substrate 10 is provided, and an N-well 12, active areas (not shown in the figure) and a P-well 13 are formed on the semiconductor substrate 10. The active areas include an active area of a selection transistor located in the N-well 12 and an active area of a storage transistor located in the P-well 13. In addition, a field oxide layer 11 may also be formed on the surface of the semiconductor substrate 10 for isolation between devices.

Wherein, the semiconductor substrate 10 may be a P-type doped silicon substrate, a silicon-germanium substrate, a compound substrate of group III-V elements, or other types of semiconductor substrates known to those skilled in the art. In the present embodiment, a silicon substrate is adopted. The method for forming the N-well 12, the P-well 13 and the active areas may be an ion implanting method, and more particularly, may be the process in the conventional BCD process for forming a high voltage P-well and a high voltage N-well.

Figure 3:
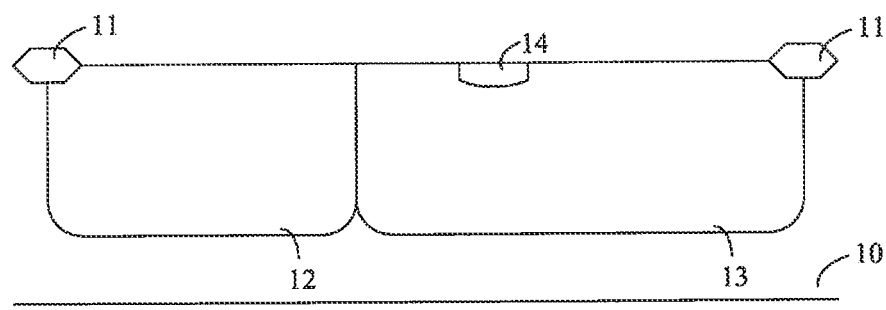

Referring in combination with FIG. 1 and FIG. 3, step S12 is performed, in which tunnel ion implanting is performed on an active area of the storage transistor, and a tunnel injection layer 14 is formed in the active area of the storage transistor. Ions implanted with respect to the tunnel icon implanting may be N-type ions, e.g., phosphorus, arsenic, etc.

Figure 4:
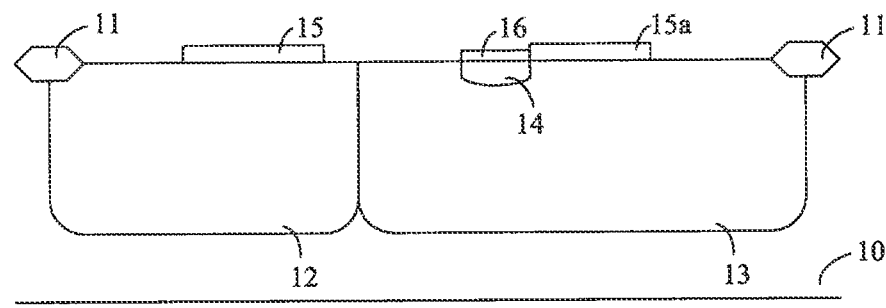

Referring in combination with FIG. 1 and FIG. 4, step S13 is performed, in which a gate dielectric layer 15 of the selection transistor is formed on an active area of the selection transistor, and a tunneling dielectric layer 16 of the storage transistor is formed on the tunnel injection layer 14. The material of the gate dielectric layer 15 of the selection transistor and the tunneling dielectric layer 16 may be silicon oxide, and the method for forming them may be a process for dual gate oxide layer in the conventional BCD process. In the present embodiment, an isolating dielectric layer 15a is formed on the active area of the storage transistor at the same time as the tunneling dielectric layer 16 and the gate dielectric layer 15 of the selection transistor are formed through the process for dual gate oxide layer. The isolating dielectric layer 15a may be formed in the same oxide layer as the gate dielectric layer 15 of the selection transistor. The isolating dielectric layer 15a has a thickness, which is the same as that of the gate dielectric layer 15 of the selection transistor and greater than that of the tunneling dielectric layer 16.

Figure 5:
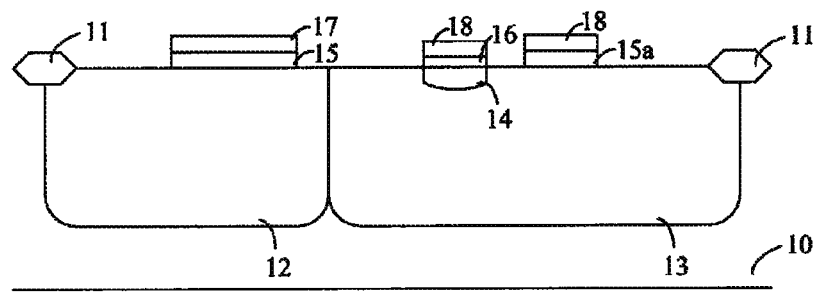

Referring in combination with FIG. 1 and FIG. 5, step S14 is performed, in which a gate 17 of the selection transistor is formed on the gate dielectric layer 15 for the selection transistor, and a floating gate 18 of the storage transistor is formed on the tunneling dielectric layer 16. Specifically, a first polysilicon layer is formed, which covers the whole surface of the semiconductor substrate 10 and the gate dielectric layer 15 of the selection transistor, the tunneling dielectric layer 16 and the isolating dielectric layer 15a. The method for forming the first polysilicon layer may be chemical vapor deposition (CVD), etc. Subsequently, the first polysilicon layer is etched (in the present embodiment, the isolating dielectric layer 15a is also etched) to form the gate 17 of the selection transistor and the floating gate 18 of the storage transistor.

Figure 6:
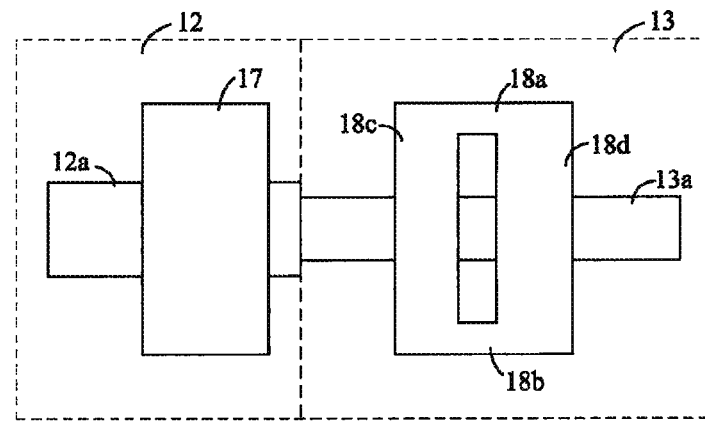

Referring to FIG. 6 (as a partial top view of FIG. 5), FIG. 6 mainly illustrates an N-well 12, an active area 12a of the selection transistor in the N-well 12, the P-well 13 and an active area 13a of the storage transistor in the P-well 13. In the present embodiment, the floating gate 18 formed through etching has a hollow box-shaped plane figure, which includes a first side 18a and a second side 18b that extend along a first direction, a third side 18c and a fourth side 18d that extend along a second direction, wherein the first direction is parallel to an extending direction of the active area 13a of the storage transistor, the second direction is perpendicular to the first direction, the active area 13a of the storage transistor is located between the first side 18a and the second side 18b, i.e., the first side 18a and the second side 18b are located at two sides of the active area 13a of the storage transistor, respectively. The active area 13a of the storage transistor is exposed by the hollow part in the floating gate 18.

In the present embodiment, the tunnel injection layer 14 of the storage transistor is located under the third side 18c, i.e., the side of the floating gate 18 that is close to the selection transistor. Such relative position arrangement and shape combined with the hollow box-shaped floating gate 18 may help improve the erase/write voltage window and the reliability of the formed storage transistor. The fourth side 18d is located above the isolating dielectric layer 15a.

Figure 7:
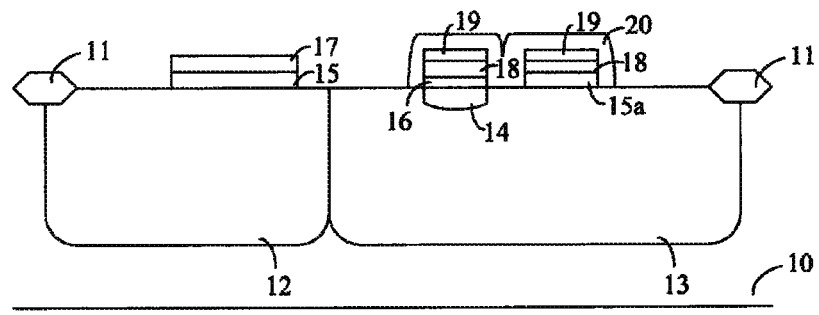

Referring in combination with FIG. 1 and FIG. 7, step S15 is performed, in which a floating gate dielectric layer 19 and a control gate 20 are formed on the floating gate 18 of the storage transistor, wherein the floating gate dielectric layer 19 covers the floating gate 18, and the control gate 20 covers the floating gate dielectric layer 19. In the present embodiment, the floating gate dielectric layer 19 is a stacked structure of silicon oxide-silicon nitride-silicon oxide (ONO).

The procedure for forming the control gate 20 may include: forming a second polysilicon layer which covers the surface of the semiconductor substrate 10, the gate 17 of the selection transistor and the floating dielectric layer 19, and subsequently, etching the second polysilicon layer to form the control gate 20. In addition, during the formation of the control gate through etching, a capacitor plate of a peripheral circuit may also be formed together, thereby the processing steps may be shared.

Figure 8:
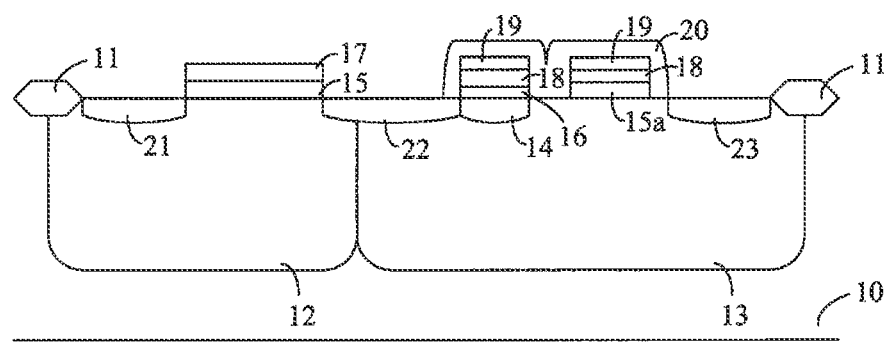

Referring in combination with FIG. 1 and FIG. 8, step S16 is formed, in which a source region and a drain region 21 of the selection transistor are formed in the active area of the selection transistor at two sides of the gate 17 of the selection transistor, and a source region 23 and a drain region of the storage transistor are formed in the active area of the storage transistor at two sides of the control gate 20. The selection transistor is an LDNMOS transistor. The drain region 21 may he formed in a P-type bulk region (not shown in the figure), wherein the P-type bulk region is formed in the N-well 12.

The method for forming the source regions and the drain regions of the selection transistor and the storage transistor may be an ion implanting method. In the present embodiment, the ions implanted are N-type ions, e.g., phosphorus, arsenic, etc. In addition, in the present embodiment, the source region of the selection transistor abuts the drain region of the storage transistor, and they share the same implantation region 22.

It is to be noted, those shown in FIGS. 2-8 are main steps only. For example, in other specific embodiments, a side wall may further be formed around the gate 17 of the selection gate and the floating gate 18 of the storage transistor. Also, during the formation procedure of the source region 21 and the drain region 22 of the storage transistor and the drain region 22 and the source region 23 of the storage transistor, a conventional lightly doped drain (LDD) formation procedure may further be included.

Subsequently, other conventional processing steps may also be conducted: forming a metal suicide on the surface of the source regions and the drain regions of the selection transistor and the storage transistor; forming an inter-layer dielectric layer which covers the selection transistor and the storage transistor; forming contact holes in the inter-layer dielectric layer above the source regions and the drain regions of the selection transistor and the storage transistor, the gate of the selection transistor and/or the control gate of the storage transistor; filling interconnection structures in the contact holes. The present embodiment utilizes a three-layer metal process, and forms three inter-layer dielectric layers respectively. Contact holes or via holes may be formed in each of the inter-layer dielectric layers respectively, and metal interconnection line may be filled therein. These are the steps which may be shared by the EEPROM core structure and the peripheral circuit for the BCD process.

So far, the EEPROM core structure embedded into the BCD process formed by the present embodiment is illustrated as FIG. 8, which includes the selection transistor and the storage transistor connected in series, wherein the selection transistor is an LDNMOS transistor. Specifically, the selection transistor mainly includes: the gate dielectric layer 15 of the selection transistor located on the active area of the selection transistor, the gate 17 of the selection transistor located on the gate dielectric layer 15 of the selection transistor, the source region 21 and the drain region 22 located at two sides of the gate 17 of the selection transistor. The storage transistor mainly includes: the tunneling dielectric layer 16 and the isolating dielectric layer 15a located on the active area of the storage transistor, the floating gate 18 located on the tunneling dielectric layer 16 and the isolating dielectric layer 15a, the floating dielectric layer 19 located on the floating gate 18, the control gate 20 located on the floating dielectric layer 19, the drain region 22 and the source region 23 located at two sides of the control gate.

Although the present invention has already been disclosed with the preferable embodiments as above, they are not intended to limit the present invention, and any skilled in the art can process possible alteration and modification without departing from the spirit and scope of the present invention, thus the protection scope of the present invention shall be defined by the claims of the present invention.

What is claimed is:

1. An EEPROM core structure embedded into a BCD process, comprising a selection transistor and a storage transistor connected in series, characterized in that, the selection transistor is an LDNMOS transistor, wherein a tunneling dielectric layer of the storage transistor and gate dielectrics of the LDNMOS transistor form in the same technology step, a floating gate of the storage transistor and a gate of LDNMOS transistor form in the same technology step, and a source region and a drain region of the storage transistor and a source region and a drain region of LDNMOS transistor form in the same technology step, and wherein the source region of the LDNMOS transistor abuts the drain region of the storage transistor.

2. The EEPROM core structure embedded into BCD process according to claim 1, characterized in that, a floating gate of the storage transistor has a hollow box-shape plane figure, which includes a first side and a second side that extend along a first direction, a third side and a fourth side that extend along a second direction, wherein the first direction is parallel to an extending direction of an active area of the storage transistor, the second direction is perpendicular to the first direction, the active area of the storage transistor is located between the first side and the second side.

3. The EEPROM core structure embedded into BCD process according to claim 2, characterized in that, the third side is close to the drain region of the storage transistor, the fourth side is close to the source region of the storage transistor, a tunnel injection layer of the storage transistor is located in the active area of the storage transistor under the third side.

4. The EEPROM core structure embedded into BCD process according to claim 3, characterized in that, a tunneling dielectric layer of he storage transistor is located under the third side and located above the tunnel injection layer, under the fourth side there is an isolating dielectric layer having a thickness identical to that of the gate dielectric layer of the selection transistor and greater than that of the tunneling dielectric layer.

5. A method for forming an EEPROM core structure embedded into BCD process, characterized in comprising:
   providing a semiconductor substrate, forming an N-well, active areas and a P-well in the semiconductor substrate, wherein the active areas include an active area of a selection transistor located in the N-well and an active area of a storage transistor located in the P-well;
   performing tunnel ion implanting on the active area of the storage transistor, forming a tunnel injection layer in the active area of the storage transistor;

forming a gate dielectric layer for the selection transistor on the active area of the selection transistor, forming a tunneling dielectric layer for the storage transistor on the tunnel injection layer;

forming a gate of the selection transistor on the gate dielectric layer of the selection transistor, forming a floating gate of the storage transistor on the tunneling dielectric layer;

forming a floating gate dielectric layer and a control gate in sequence on the floating gate of the storage transistor, wherein the floating gate is covered by the floating gate dielectric layer, and the floating gate dielectric layer is covered by the control gate;

forming a source region and a drain region of the selection transistor in the active area of the selection transistor at two sides of the gate of the selection transistor, forming a source region and a drain region of the storage transistor in the active area of the storage transistor at two sides of the control gate, wherein the selection transistor is an LDNMOS transistor.

6. The method for forming an EEPROM core structure embedded into BCD process according to claim 5, characterized in that, forming a gate of the selection transistor on the gate dielectric layer of the selection transistor and forming a floating gate of the storage transistor on the tunneling dielectric layer comprise: forming a first polysilicon layer and etching the first polysilicon layer to form the gate of the selection transistor and the floating gate, wherein the floating gate has a hollow box-shaped plane figure, which includes a first side and a second side that extend along a first direction, a third side and a fourth side that extend along a second direction, wherein the first direction is parallel to an extending direction of the active area of the storage transistor, the second direction is perpendicular to the first direction, the active area of the storage transistor is located between the first side and the second side.

7. The method for forming an EEPROM core structure embedded into BCD process according to claim 6, characterized in that, the source region of the selection transistor abuts the drain region of the storage transistor.

8. The method for forming an EEPROM core structure embedded into BCD process according to claim 7, characterized in that, the third side is close to the drain region of the storage transistor, the fourth side is close to the source region of the storage transistor, and the third side covers the tunnel injection layer of the storage transistor.

9. The method for forming an EEPROM core structure embedded into BCD process according to claim 6, characterized in that, an isolating dielectric layer is further formed on the active area of the storage transistor during the formation of the gate dielectric layer of the selection layer and the tunneling dielectric layer of the storage layer, the fourth side of the floating gate is formed on the isolating dielectric layer, and the isolating dielectric layer has a thickness identical to that of the gate dielectric layer of the selection transistor and greater than that of the tunneling dielectric layer.

10. The method for forming an EEPROM core structure embedded into BCD process according to claim 5, characterized in that, the formation of the control gate comprises: forming a second polysilicon layer and etching the second polysilicon layer to form the control gate of the storage transistor, and forming a capacitor plate of a peripheral circuit.

11. The method for forming an EEPROM core structure embedded into BCD process according to claim 5, characterized in that, after forming the source region of the selection transistor and the drain region of the storage transistor, the method further comprises:

forming metal silicide on the surface of the source regions and the drain regions of the selection transistor and the storage transistor;

forming an inter-layer dielectric layer covering the selection transistor and the storage transistor;

forming contact holes in the inter-layer dielectric layer above the source regions and the drain regions of the selection transistor and the storage transistor, the gate of the selection transistor and/or the control gate of the storage transistor;

filling interconnection structures in the contact holes.

* * * * *

UNITED STATES PATENT AND TRADEMARK OFFICE
CERTIFICATE OF CORRECTION

PATENT NO.       : 9,553,206 B2  
APPLICATION NO.  : 14/238057  
DATED            : January 24, 2017  
INVENTOR(S)      : Jianhua Liu Page 1 of 1

It is certified that error appears in the above-identified patent and that said Letters Patent is hereby corrected as shown below:

In the Specification

Column 3, Line 26 change "after *forming" to --after forming--

Column 7, Line 13 change "suicide" to --silicide--

Column 9, Line 21 change "may he" to --may be--

Column 9, Line 42 change "suicide" to --silicide--

Signed and Sealed this  
Sixteenth Day of May, 2017

Michelle K. Lee  
*Director of the United States Patent and Trademark Office*